United States Patent [19]

Singh et al.

[11] Patent Number: 5,780,772
[45] Date of Patent: Jul. 14, 1998

[54] SOLUTION TO MOLD WIRE SWEEP IN FINE PITCH DEVICES

[75] Inventors: Inderjit Singh, San Jose; Jaime A. Bayan, Palo Alto, both of Calif.

[73] Assignee: National Semiconductor Corporation, Santa Clara, Calif.

[21] Appl. No.: 788,546

[22] Filed: Jan. 24, 1997

[51] Int. Cl.$^6$ ................................................ H01L 23/28
[52] U.S. Cl. ................. 174/52.2; 174/52.4; 361/813; 264/272.17; 438/123; 438/124
[58] Field of Search ........................ 174/52.2, 52.4, 174/52.1, 52.3; 361/813; 264/272.17, 272.15, 276; 257/667, 666, 787, 670; 438/123, 124

[56] References Cited

U.S. PATENT DOCUMENTS

| | | | |
|---|---|---|---|
| 4,534,105 | 8/1985 | Reusch | 29/589 |
| 4,928,162 | 5/1990 | Lesk et al. | 257/693 |

FOREIGN PATENT DOCUMENTS 7-106364   4/1995   Japan ........................ H01L 21/60

*Primary Examiner*—Bot L. Ledynh
*Assistant Examiner*—Kristina Soderquist
*Attorney, Agent, or Firm*—Beyer & Weaver, LLP

[57] ABSTRACT

A method of preventing non-uniform bonding wire sweep during an encapsulating process of an integrated circuit package includes the step of forming an encapsulating material flow restricting element between two widely spaced functional bonding wires. The integrated circuit package includes an array of electrically conductive leads for electrically connecting the package to other electrical elements and an integrated circuit die having a plurality of input/output terminal pads. A plurality of functional bonding wires electrically connects certain ones of the input/output terminal pads to associated electrically conductive leads such that the functional bonding wires have a predetermined pitch which defines an approximate minimum desired spacing between adjacent functional bonding wires. The plurality of functional bonding wires includes two widely spaced functional bonding wires which are spaced apart from one another by a distance substantially greater than the predetermined minimum desired spacing. An encapsulating material surrounds the die, the bonding wires, and at least portions of the leads. The encapsulating material flow restricting element restricts the flow of the encapsulating material in the area between the two widely spaced functional bonding wires during the encapsulating process of the package thereby preventing excessive, non-uniform bonding wire sweep of either of the two widely spaced functional bonding wires during the encapsulating process. In one embodiment, the encapsulating material flow restricting element is at least one additional non-functional bonding wire formed between the two widely spaced functional bonding wires.

2 Claims, 3 Drawing Sheets

SOLUTION TO MOLD WIRE SWEEP IN FINE PITCH DEVICES

BACKGROUND OF THE INVENTION

The present invention relates generally to integrated circuit packages and more specifically to a method and arrangement for preventing non-uniform bonding wire sweep during the encapsulating process of a fine pitch integrated circuit package.

In the integrated circuit packaging industry, there is a continuous desire to provide higher and higher density integrated circuit packages for integrated circuit die having increasing numbers of input/output terminal pads. When using a conventional wire bonding packaging technique, the pitch, or spacing between adjacent bonding wires becomes finer and finer as the number of input/output terminal pads increases for a given size die. This presents the problem of having two adjacent bonding wires electrically short to one another due to bonding wire sweep during the encapsulating process of producing the integrated circuit package. Although a variety of approaches have been suggested for reducing the bonding wire sweep during the encapsulating process of an integrated circuit package, many of these approaches require additional process steps or require specialized equipment. These requirements for additional process steps or specialized equipment add to the costs of producing the package and are therefore undesirable.

FIG. 1 illustrates a partial cut away plan view of one corner of a typical integrated circuit package 10. The package includes an integrated circuit die 12 having a plurality of input/output terminal pads 14 located on the top surface of the die. Die 12 is supported by a die attach pad 16 of an overall lead frame 18. Lead frame 18 also includes a plurality of electrically conductive leads 20 for electrically connecting integrated circuit package 10 to other electrical elements. Furthermore, lead frame 18 includes tie bars 22 (only one of which is shown in FIG. 1) for maintaining die attach pad 16 in position relative to leads 20 during the assembly of the package. An array of bonding wires 24 electrically connect respective ones of input/output terminal pads 14 to associated leads 20. Bonding wires 24 are arranged to have a predetermined pitch which defines a minimum desired spacing between adjacent bonding wires. This pitch, or minimum spacing, is indicated by the reference letter S in FIG. 1.

As indicated by arrow 26 in FIG. 1, an encapsulating material, indicated by wavy lines 28, is injected into a mold 30 to encapsulate die 12, bonding wires 24, and at least portions of leads 20. In this example, encapsulating material 28 is injected into one of the corners of mold 30 such that the encapsulating material flows diagonally across the assembly of components making up the package. As the encapsulating material flows diagonally across the assembly, the leading edge of the encapsulating material impacts each successive bonding wire causing them to displace slightly in the direction of the flow of the material. This is referred to as bonding wire sweep or mold wire sweep.

In most cases, the relative bonding wire sweep of each successive bonding wire is fairly consistent from bonding wire to bonding wire and therefore the adjacent bonding wires do not normally come into contact with one another causing an electrical short. However, applicants have discovered that in situations where the spacing between two widely spaced bonding wires is substantially larger than the predetermined minimum spacing, the wire sweep of the downstream bonding wire relative to the flow of the encapsulating material can be substantially greater than the wire sweep of other consistently spaced bonding wires. This greater wire sweep of the downstream bonding wire of the two widely spaced bonding wires may lead to shorting between this downstream bonding wire and the next successive downstream bonding wire.

The tie bar region of a typical integrated circuit package is one region in which two widely spaced bonding wires are commonly found. As illustrated in FIG. 1, two widely spaced bonding wires 24a and 24b are positioned on opposite sides of tie bar 22 and are spaced apart by a distance indicated by the reference letter D. For many package configurations, because of the tie bar and the physical configuration of the package, distance D is often substantially greater than the minimum desired spacing S described above which is defined by the pitch of package 10. Because of this larger distance D between widely spaced bonding wires 24a and 24b, the resistance to the flow of the encapsulating material is lower in this tie bar region between widely spaced bonding wires 24a and 24b. This lower resistance allows the flow of the encapsulating material to pick up speed and momentum. Therefore, when the flow of the encapsulating material indicated by lines 28 impacts the downstream bonding wire 24b of the two widely spaced bonding wires, it causes a greater amount of bonding wire sweep compared to other bonding wires within the package. This greater bonding wire sweep may result in an electrical short between the downstream bonding wire 24b of the two widely spaced bonding wires and a next successive downstream bonding wire 24c as illustrated in FIG. 1. The present invention provides methods and arrangements for eliminating or substantially reducing this greater bonding wire sweep problem associated with widely spaced bonding wires.

SUMMARY OF THE INVENTION

As will be described in more detail hereinafter, a method of preventing non-uniform bonding wire sweep during an encapsulating process of an integrated circuit package is herein disclosed. The integrated circuit package includes an array of electrically conductive leads for electrically connecting the package to other electrical elements and an integrated circuit die having a plurality of input/output terminal pads. A plurality of functional bonding wires electrically connects certain ones of the input/output terminal pads to associated electrically conductive leads such that the functional bonding wires have a predetermined pitch which defines an approximate minimum desired spacing between adjacent functional bonding wires. The plurality of functional bonding wires includes two widely spaced functional bonding wires which are spaced apart from one another by a distance substantially greater than the predetermined minimum desired spacing. An encapsulating material surrounds the die, the bonding wires, and at least portions of the leads. The method includes the step of, prior to the encapsulating process of the package, forming an encapsulating material flow restricting element between the two widely spaced functional bonding wires. The encapsulating material flow restricting element restricts the flow of the encapsulating material in the area between the two widely spaced functional bonding wires during the encapsulating process of the package thereby preventing excessive, non-uniform bonding wire sweep of either of the two widely spaced functional bonding wires during the encapsulating process.

In one embodiment of the method the direction of the flow of the encapsulating material during the encapsulating process is generally perpendicular to the two widely spaced functional bonding wires.

In another embodiment, the step of forming an encapsulating material flow restricting element includes the step of forming at least one additional non-functional bonding wire such that the non-functional bonding wire is positioned between the two widely spaced functional bonding wires. Also, the array of electrically conductive leads is provided as part of a lead frame with the lead frame further including a die attach pad for supporting the die and at least one tie bar for supporting the die attach pad in a predetermined location relative to the leads. The two widely spaced functional bonding wires are positioned on opposite sides of the tie bar and the step of forming the non-functional bonding wire includes the step of bonding one end of the non-functional bonding wire to the tie bar. In one version of this embodiment, the other end of the non-functional bonding wire is bonded to the die attach pad. Alternatively, the die may include a non-functional input/output terminal pad and the other end of the non-functional bonding wire may be bonded to the non-functional input/output terminal pad.

An integrated circuit package is also herein disclosed. The package includes an integrated circuit die having a plurality of die input/output terminal pads and an array of electrically conductive leads for electrically connecting the package to other electrical elements. A plurality of functional bonding wires electrically connects certain ones of the input/output terminal pads to associated electrically conductive leads such that the functional bonding wires have a predetermined pitch which defines an approximate minimum desired spacing between adjacent functional bonding wires. The plurality of functional bonding wires includes two widely spaced functional bonding wires which are spaced apart from one another by a distance substantially greater than the predetermined minimum desired spacing. An encapsulating material flow restricting element is located between the two widely spaced functional bonding wires for restricting the flow of the encapsulating material in the area between the two widely spaced functional bonding wires during an encapsulating process of the package. And finally, an encapsulating material surrounds the die, the functional bonding wires, the encapsulating material flow restricting element, and at least portions of the leads.

In one embodiment of the package, the encapsulating material flow restricting element is at least one additional non-functional bonding wire positioned between the two widely spaced functional bonding wires. Also, the array of electrically conductive leads is part of a lead frame and the lead frame further includes a die attach pad for supporting the die and at least one tie bar for supporting the die attach pad in a predetermined location relative to the leads. The two widely spaced functional bonding wires are located on opposite sides of the tie bar and one end of the non-functional bonding wire is connected to the tie bar. In a first version of this embodiment, the other end of the non-functional bonding wire is connected to the die attach pad. Alternatively, the die may include a non-functional input/output terminal pad and the other end of the non-functional bonding wire may be connected to the non-functional input/output terminal pad.

BRIEF DESCRIPTION OF THE DRAWINGS

The features of the present invention may best be understood by reference to the following description of the presently preferred embodiments together with the accompanying drawings.

DETAILED DESCRIPTION OF THE PREFERRED EMBODIMENTS

An invention is herein described for providing methods and apparatus for preventing non-uniform bonding wire sweep in an integrated circuit package during an encapsulating process of the package. These methods and apparatus are most applicable to integrated circuit packages having a certain pitch which defines a minimum desired spacing between adjacent bonding wires and which includes two widely spaced bonding wires that are spaced apart from one another by a distance substantially greater than the minimum desired spacing defined by the pitch.

In the following description, numerous specific details are set forth in order to provide a thorough understanding of the present invention. However, in view of this description, it will be obvious to one skilled in the art that the present invention may be embodied in a wide variety of specific configurations. Also, well known integrated circuit manufacturing processes such as conventional wire bonding processes, integrated circuit package encapsulating or molding processes, and other such conventional integrated circuit manufacturing processes will not be described in detail in order not to unnecessarily obscure the present invention.

Figure 1:
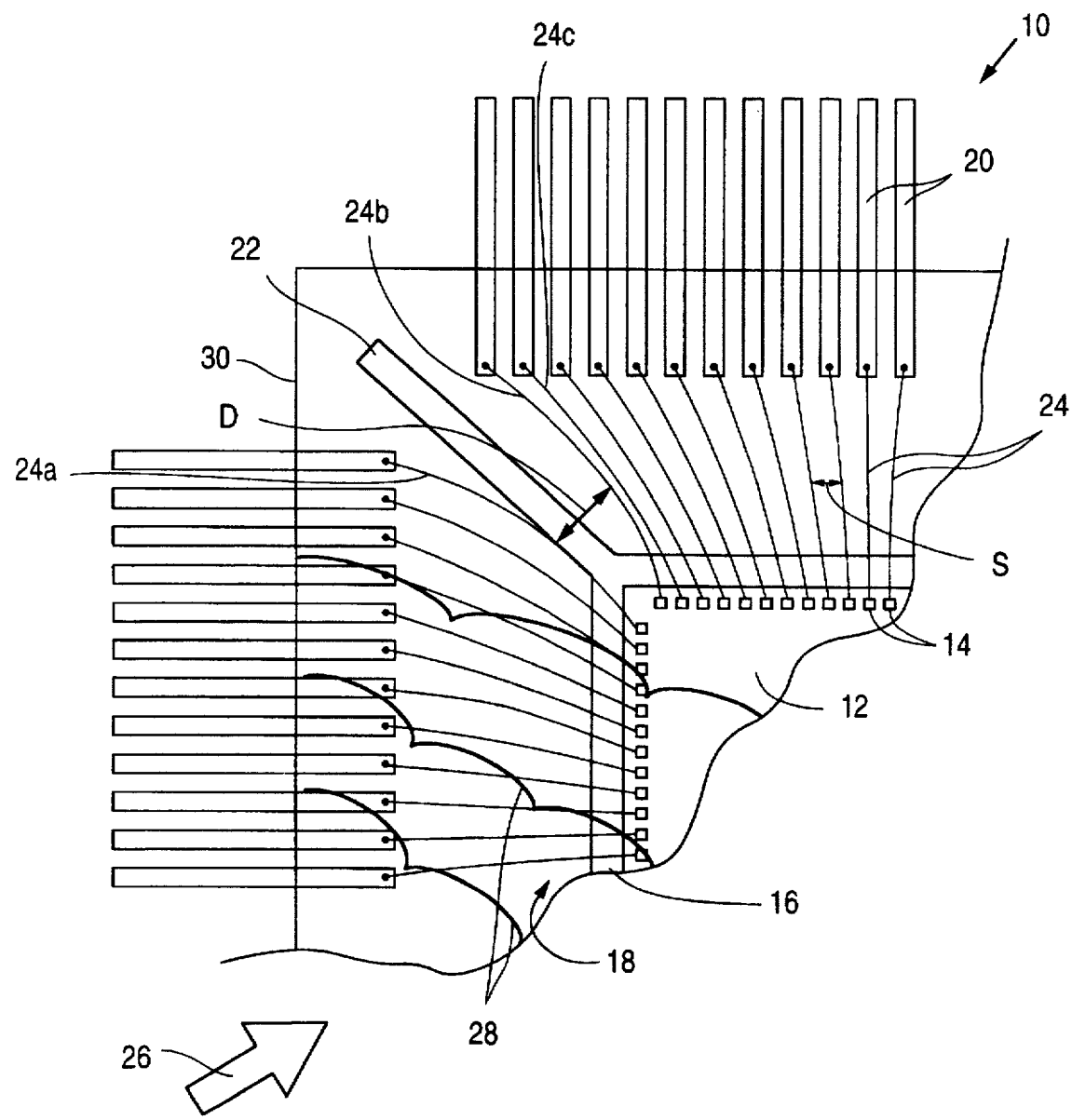
FIG. 1 is a diagrammatic, partial cut away, plan view of a prior art integrated circuit package illustrating the non-uniform bonding wire sweep of two widely spaced bonding wires resulting from the encapsulating process of the package.
Figure 2:
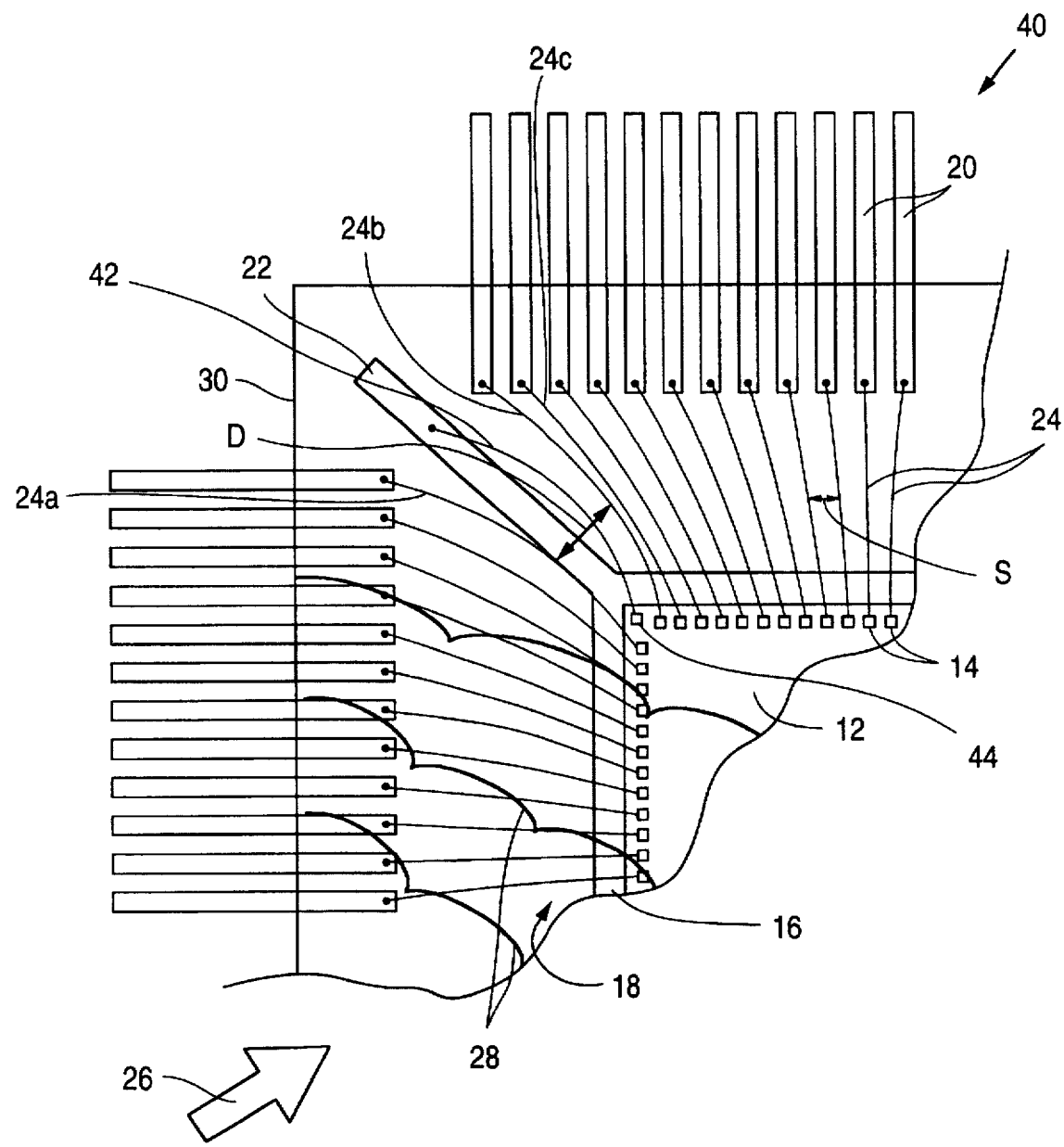
FIG. 2 is a diagrammatic, partial cut away, plan view of a first embodiment of an integrated circuit package in accordance with the present invention including an encapsulating material flow restricting element for restricting non-uniform bonding wire sweep of two widely spaced bonding wires.

Referring initially to FIG. 2, a first embodiment of an integrated circuit package designed in accordance with the invention will be described. FIG. 2 illustrates a partial cut away plan view of one corner of a integrated circuit package 40 designed in accordance with the invention. For illustrative purposes, package 40 of FIG. 2 has a configuration similar to that of integrated circuit package 10 of FIG. 1. As will be the case throughout the various figures of this description, like components of the various figures are designated by like reference numerals.

As described for package 10, package 40 includes an integrated circuit die 12 having a plurality of input/output terminal pads 14 located on the top surface of the die. Die 12 is supported by a die attach pad 16 of an overall lead frame 18. Lead frame 18 also includes a plurality of electrically conductive leads 20 for electrically connecting integrated circuit package 40 to other electrical elements. Furthermore, lead frame 18 includes tie bars 22 (only one of which is shown in FIG. 2) for maintaining die attach pad 16 in position relative to leads 20 during the assembly of the package. An array of functional bonding wires 24 electrically connect respective ones of input/output terminal pads 14 to associated leads 20. Functional bonding wires 24 are arranged to have a predetermined pitch which defines a minimum desired spacing between adjacent bonding wires. This pitch, or minimum spacing, is indicated by the reference letter S.

Although package 40 has been described as including a conventional lead frame having a plurality of leads, a die attach pad, and tie bars, these specific features are not a requirement of the invention. Instead, it should be understood that the invention would apply to packages including a wide variety of lead frames having a wide variety of configurations. Also, the lead frame may be replaced with a variety of other conventional arrangements, such as flex tape substrates, that provide the electrical connection between the bonding wires and an external element to which the package is to be connected. All of these other various arrangements and lead frame configurations would equally fall within the scope of the invention so long as bonding wires are used to electrically connect the die to the lead frame or other electrical connecting arrangement.

As described above in the background for package 10 of FIG. 1, package 40 of FIG. 2 has two widely spaced functional bonding wires 24a and 24b positioned on opposite sides of tie bar 22 and are spaced apart by a distance indicated by the reference letter D. This distance D is substantially greater than the minimum desired spacing S which is defined by the pitch of package 40. However, in accordance with the invention, package 40 also includes an encapsulating material flow restricting element positioned between widely spaced functional bonding wires 24a and 24b. As will be described in more detail hereinafter, the encapsulating material flow restricting element restricts the flow of the encapsulating material between the widely spaced functional bonding wires during the encapsulation process of the package thereby preventing or substantially reducing non-uniform bonding wire sweep of downstream functional bonding wire 24b.

In the embodiment shown in FIG. 2, the encapsulating material flow restricting element takes the form of a non-functional bonding wire 42. Also, die 12 includes a non-functional input/output terminal pad 44. Pad 44 is not electrically connected to any of the functional electrical components making up die 12 and its only purpose is to provide a point of attachment for one end of non-functional bonding wire 42. The other end of non-functional bonding wire 42 is attached to tie bar 22.

As indicated by arrow 26 in FIG. 2 and as described above for FIG. 1, the encapsulating material, which is indicated by wavy lines 28, is injected into a mold 30 to encapsulate die 12, functional bonding wires 24, non-functional bonding wire 42, and at least portions of leads 20. As described above in the background, when the encapsulating material flows diagonally across the assembly, the leading edge of the encapsulating material impacts each successive bonding wire causing them to displace slightly in the direction of the flow of the material. Although the encapsulating material has been described as being injected into the mold so that is flows diagonally across the assembly, this is not a requirement of the invention. Instead, it should be understood that the encapsulating material may be injected in any appropriate manner such that it flows across the assembly in any predetermined direction.

In accordance with the invention, non-functional bonding wire 42 acts as a encapsulating material flow restricting element restricting the encapsulating material from picking up speed and momentum between widely spaced functional bonding wires 24a and 24b as described above in the background. Without this increased speed and momentum, the impact of the flow of the encapsulating material on downstream functional bonding wire 24b of the two widely spaced functional bonding wires is not substantially different than the impact of the flow of the encapsulating material on other bonding wires. Therefore, the flow of the encapsulating material does not cause functional bonding wire 24b to have a substantially greater amount of bonding wire sweep when compared to other bonding wires within the package. This eliminates or substantially reduces the chances of an electrical short between downstream functional bonding wire 24b of the two widely spaced bonding wires and a next successive downstream bonding wire 24c as illustrated in FIG. 2.

Although the encapsulating material flow restricting element of FIG. 2 has been described and illustrated as a single non-functional bonding wire, this is not a requirement. Instead, any number of non-functional bonding wires may be used depending on the requirements of the specific integrated circuit package. For Example, in situations in which the spacing between the two widely spaced functional bonding wires is several times the desired minimum spacing defined by the pitch of the package, multiple non-functional bonding wires may be formed between the two widely spaced functional bonding wires.

One of the advantages of the approach of using a non-functional bonding wire to act as the encapsulating material flow restricting element is that the same wire bonding equipment that is used to form the functional bonding wires may be used to form the non-functional bonding wire flow restricting element. This means that no additional process steps are required to form the restricting element. This minimizes the cost of using this approach. Also, in designs in which the die attach pad and the tie bar are not electrically grounded, this approach will still produce a good overall package even if the non-functional bonding wire or wires which act as the flow restricting element end up making contact with one of the functional bonding wires due to bonding wire sweep.

Figure 3:
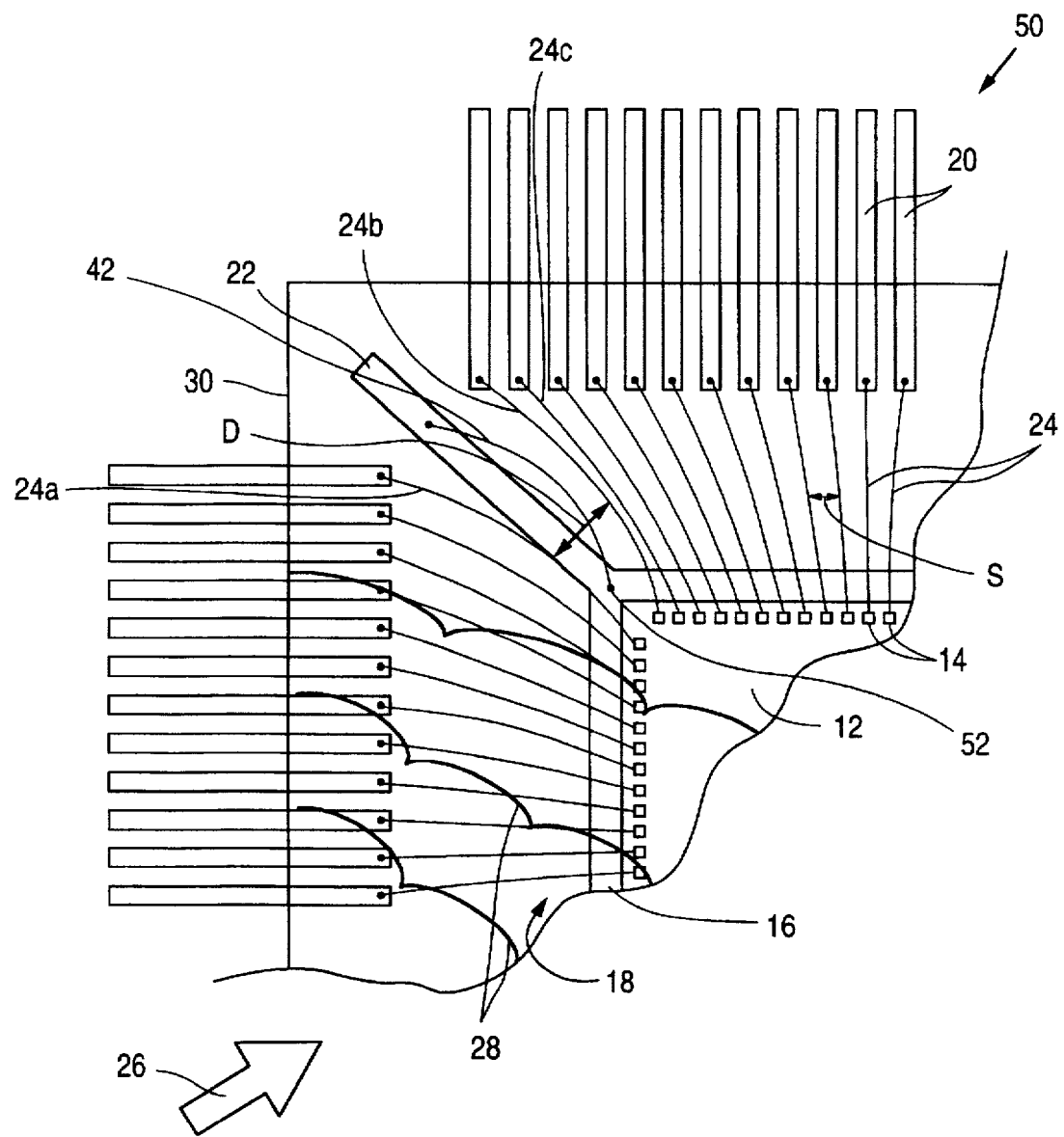
FIG. 3 is a diagrammatic, partial cut away, plan view of a second embodiment of an integrated circuit package in accordance with the present invention including an encapsulating material flow restricting element for restricting non-uniform bonding wire sweep of two widely spaced bonding wires.

Although the die of FIG. 2 has been described as including an extra non-functional input/output terminal pad 44 to which one end of the non-functional bonding wire is attached, this is not a requirement. FIG. 3 illustrates an second embodiment of an integrated circuit package 50 designed in accordance with the invention which does not require the die to include an extra non-functional input/output terminal pad. Package 50 of FIG. 3 includes all of the elements of package 40 of FIG. 2 with the exception of non-functional input/output terminal pad 44. As shown in FIG. 3, for this embodiment, one end of non-functional bonding wire 42 is attached to tie bar 22 as described above for package 40. However, in this case, the other end of non-functional bonding wire 42 is attached to die attach pad 16 at attachment point 52 adjacent to die 12 and between widely spaced functional bonding wires 24a and 24b.

The configuration of FIG. 3 provides still another advantage of this approach. That is, this approach may easily be applied to existing integrated circuit package designs which are exhibiting bonding wire sweep problems due to widely spaced functional bonding wires without requiring any change in any of the components making up the existing integrated circuit package design. In many package designs, particularly problematic regions of the package design can account for an overwhelming majority of problems causing failures in the package and reducing the manufacturing yield for that package design. An example of one of these potentially problematic regions is the tie bar region described above in which two widely spaced functional bonding wires are positioned on opposite sides of the tie bar. The method of the present invention may be easily applied to these problematic regions at a minimal cost without requiring any changes to the package design and without requiring any additional process steps. In many cases this can result in dramatic increases in the manufacturing yield for a particular package design.

Although the above described embodiments have been describe as using a non-functional bonding wire as the encapsulating material flow restricting element, this is not a requirement of the invention. Instead, a wide variety of flow restricting structures or elements may be utilized to restrict the flow of the encapsulating material in the space between the two widely spaced functional bonding wires. Any of these various structures or elements would equally fall within the scope of the invention so long as they restrict the increase in speed and momentum of the encapsulating material in the space between the widely spaced functional bonding wires. Also, although the integrated circuit package has been described with the various components having particular respective orientations, it should be understood that the present invention may take on a wide variety of specific configurations with the various components being located in a wide variety of positions and mutual orientations and still remain within the scope of the present invention. Therefore, the present examples are to be considered as illustrative and not restrictive, and the invention is not to be limited to the details given herein, but may be modified within the scope of the appended claims.

What is claimed is:

1. A method of preventing non-uniform bonding wire sweep during an encapsulating process of an integrated circuit package, the integrated circuit package including (i) an integrated circuit die having a plurality of input/output terminal pads, (ii) a lead frame having an array of electrically conductive leads for electrically connecting the package to other electrical elements, a die attach pad for supporting the die, and at least one tie bar for supporting the die attach pad in a predetermined location relative to the leads, (iii) a plurality of functional bonding wires electrically connecting certain ones of the input/output terminal pads to associated ones of the electrically conductive leads such that the functional bonding wires have a predetermined pitch which defines an approximate minimum desired spacing between adjacent functional bonding wires, the plurality of functional bonding wires including two widely spaced functional bonding wires which are spaced apart from one another by a distance substantially greater than the predetermined minimum desired spacing, the two widely spaced functional bonding wires being located on opposite sides of the tie bar, and (iv) an encapsulating material surrounding the die, the plurality of bonding wires, and at least portions of the leads, the method comprising the step of:

prior to the encapsulating process of the package, forming at least one additional non-functional bonding wire between the two widely spaced functional bonding wires for restricting the flow of the encapsulating material in the area between the two widely spaced functional bonding wires during the encapsulating process of the package thereby preventing excessive, non-uniform bonding wire sweep of either of the two widely spaced functional bonding wires during the encapsulating process, one end of the non-functional bonding wire being connected to the tie bar and the other end of the non-functional bonding wire being connected to the die attach pad.

2. An integrated circuit package comprising:

an integrated circuit die including a plurality of die input/output terminal pads;

a lead frame including an array of electrically conductive leads for electrically connecting the package to other electrical elements, a die attach pad for supporting the die, and at least one tie bar for supporting the die attach pad in a predetermined location relative to the leads;

a plurality of functional bonding wires electrically connecting certain ones of the input/output terminal pads to associated ones of the electrically conductive leads such that the functional bonding wires have a predetermined pitch which defines an approximate minimum desired spacing between adjacent functional bonding wires, the plurality of functional bonding wires including two widely spaced functional bonding wires which are spaced apart from one another by a distance substantially greater than the predetermined minimum desired spacing, the two widely spaced functional bonding wires being located on opposite sides of the tie bar;

at least one additional non-functional bonding wire located between the two widely spaced functional bonding wires for restricting the flow of the encapsulating material in the area between the two widely spaced functional bonding wires during an encapsulating process of the package thereby preventing excessive, non-uniform bonding wire sweep of either of the two widely spaced functional bonding wires during the encapsulating process, one end of the non-functional bonding wire being connected to the tie bar and the other end of the non-functional bonding wire being connected to the die attach pad; and an encapsulating material surrounding the die, the plurality of functional bonding wires, the encapsulating material flow restricting element, and at least portions of the leads.

\* \* \* \* \*